(12) United States Patent
Kamijo et al.

(10) Patent No.: US 9,391,257 B2
(45) Date of Patent: Jul. 12, 2016

(54) ACTUATOR, ROBOT HAND, ROBOT, ELECTRONIC COMPONENT CARRYING DEVICE, ELECTRONIC COMPONENT INSPECTION DEVICE, AND PRINTER

(71) Applicant: Seiko Epson Corporation, Tokyo (JP)

(72) Inventors: Koichi Kamijo, Matsumoto (JP);
Nobuyuki Mizushima, Shiojiri (JP);
Osamu Miyazawa, Shimosuwa (JP)

(73) Assignee: Seiko Epson Corporation (JP)

( * ) Notice: Subject to any disclaimer, the term of this patent is extended or adjusted under 35 U.S.C. 154(b) by 594 days.

(21) Appl. No.: 13/705,447

(22) Filed: Dec. 5, 2012

(65) Prior Publication Data

US 2013/0140954 A1    Jun. 6, 2013

(30) Foreign Application Priority Data

Dec. 6, 2011   (JP) ................. 2011-266546

(51) Int. Cl.

| | |
|---|---|
| H01L 41/08 | (2006.01) |
| H01L 41/053 | (2006.01) |
| H01L 41/09 | (2006.01) |
| B25J 15/02 | (2006.01) |
| H02N 2/00 | (2006.01) |
| H02N 2/02 | (2006.01) |
| H02N 2/10 | (2006.01) |

(Continued)

(52) U.S. Cl.
CPC .......... *H01L 41/053* (2013.01); *B25J 15/0009* (2013.01); *B25J 15/024* (2013.01); *H01L 41/0926* (2013.01); *H02N 2/004* (2013.01); *H02N 2/006* (2013.01); *H02N 2/0015* (2013.01); *H02N 2/026* (2013.01); *H02N 2/028* (2013.01); *H02N 2/103* (2013.01); *H02N 2/108* (2013.01); *B41J 19/20* (2013.01); *Y10S 901/32* (2013.01)

(58) Field of Classification Search
USPC .............. 310/330, 348, 323.01, 323.02, 328, 310/323.03, 323.16, 311
IPC ....................................................... H01L 41/09
See application file for complete search history.

(56) References Cited

U.S. PATENT DOCUMENTS

| | | | |
|---|---|---|---|
| 5,136,200 A * | 8/1992 | Takizawa | H02N 2/003 310/323.18 |
| 5,453,653 A | 9/1995 | Zumeris | |
| 5,616,980 A | 4/1997 | Zumeris | |

(Continued)

FOREIGN PATENT DOCUMENTS

| | | |
|---|---|---|
| CN | 102092049 A | 6/2011 |
| EP | 0 755 054 A2 | 1/1997 |

(Continued)

OTHER PUBLICATIONS

Extended European Search Report for Application No. EP 12 19 5452 dated Aug. 11, 2014 (6 pages).

*Primary Examiner* — Karen B Addison
(74) *Attorney, Agent, or Firm* — Harness, Dickey & Pierce, P.L.C.

(57) ABSTRACT

An actuator includes a vibrating piezoelectric element, and a holding unit that holds the piezoelectric element, in which the holding unit is disposed on a vibrating surface of the piezoelectric element, and includes a first support unit and a second support unit that are disposed on one side of the piezoelectric element, and a third support unit and a fourth support unit that are disposed on the other side of the piezoelectric element.

9 Claims, 12 Drawing Sheets

(51) Int. Cl.
  *B25J 15/00* (2006.01)
  *B41J 19/20* (2006.01)

(56) References Cited

U.S. PATENT DOCUMENTS

| | | | |
|---|---|---|---|
| 5,682,076 | A | 10/1997 | Zumeris |
| 5,714,833 | A * | 2/1998 | Zumeris ............... G11B 5/5552 |
| | | | 310/328 |
| 5,777,423 | A | 7/1998 | Zumeris |
| 5,877,579 | A | 3/1999 | Zumeris |
| 6,064,140 | A | 5/2000 | Zumeris |
| 6,211,603 | B1 | 4/2001 | Iino et al. |
| 6,455,983 | B2 | 9/2002 | Dettmann et al. |
| 7,378,777 | B2 * | 5/2008 | Moteki ............... H01L 41/0913 |
| | | | 310/323.02 |
| 7,586,237 | B2 | 9/2009 | Hashimoto |
| 7,633,207 | B2 | 12/2009 | Sakamoto |
| 7,663,292 | B2 * | 2/2010 | Adachi .................... 310/323.16 |
| 7,671,516 | B2 | 3/2010 | Adachi et al. |
| 8,018,123 | B2 | 9/2011 | Mukae |
| 2004/0027032 | A1 * | 2/2004 | Moteki ............... H01L 41/0913 |
| | | | 310/323.02 |
| 2007/0188050 | A1 * | 8/2007 | Hashimoto ........... H01L 41/053 |
| | | | 310/323.02 |
| 2011/0018394 | A1 | 1/2011 | Mukae |
| 2011/0133606 | A1 | 6/2011 | Yoshida et al. |

FOREIGN PATENT DOCUMENTS

| | | |
|---|---|---|
| JP | 07-039178 | 2/1995 |
| JP | 2004-187384 | 7/2004 |
| JP | 2004-298973 A | 10/2004 |
| JP | 2007-189900 | 7/2007 |
| JP | 2007-202398 | 8/2007 |
| JP | 2007-221865 | 8/2007 |
| JP | 2007-318997 | 12/2007 |
| JP | 2008-218953 A | 9/2008 |
| JP | 2010-041777 A | 2/2010 |
| WO | 2007-080851 | 7/2007 |
| WO | 2008-093799 | 8/2008 |

* cited by examiner

FIG. 1A
FIG. 1B
FIG. 1C
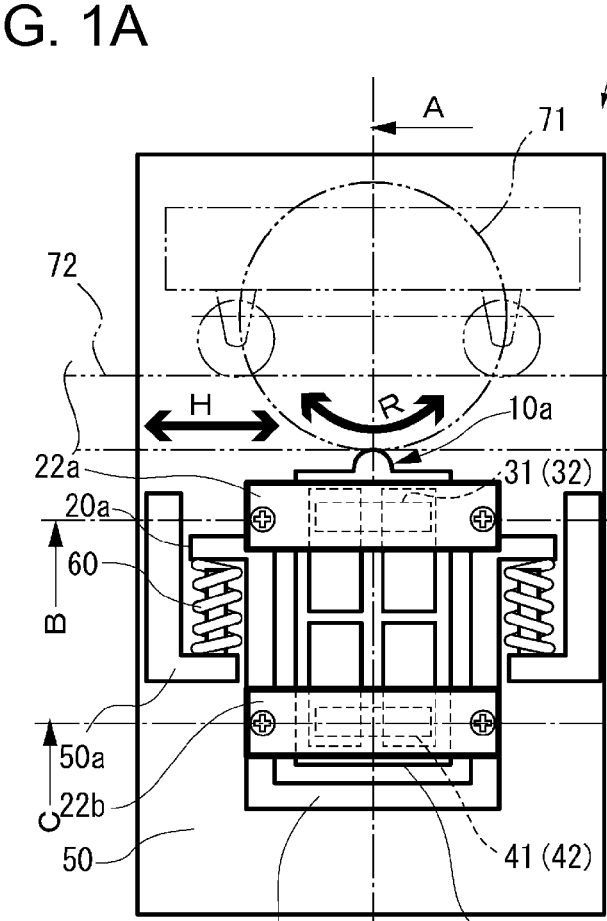
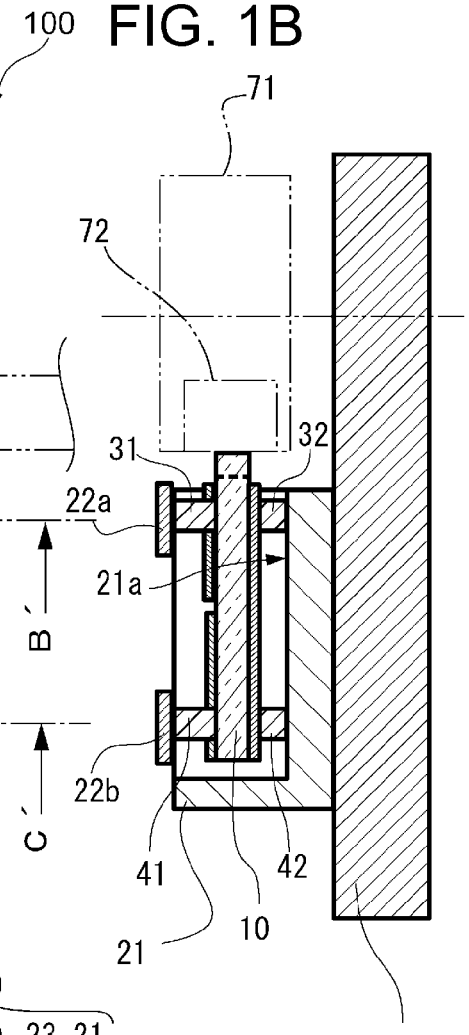
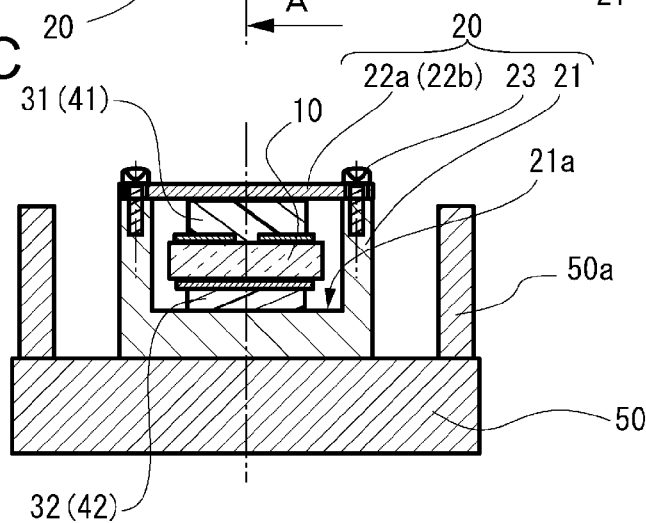

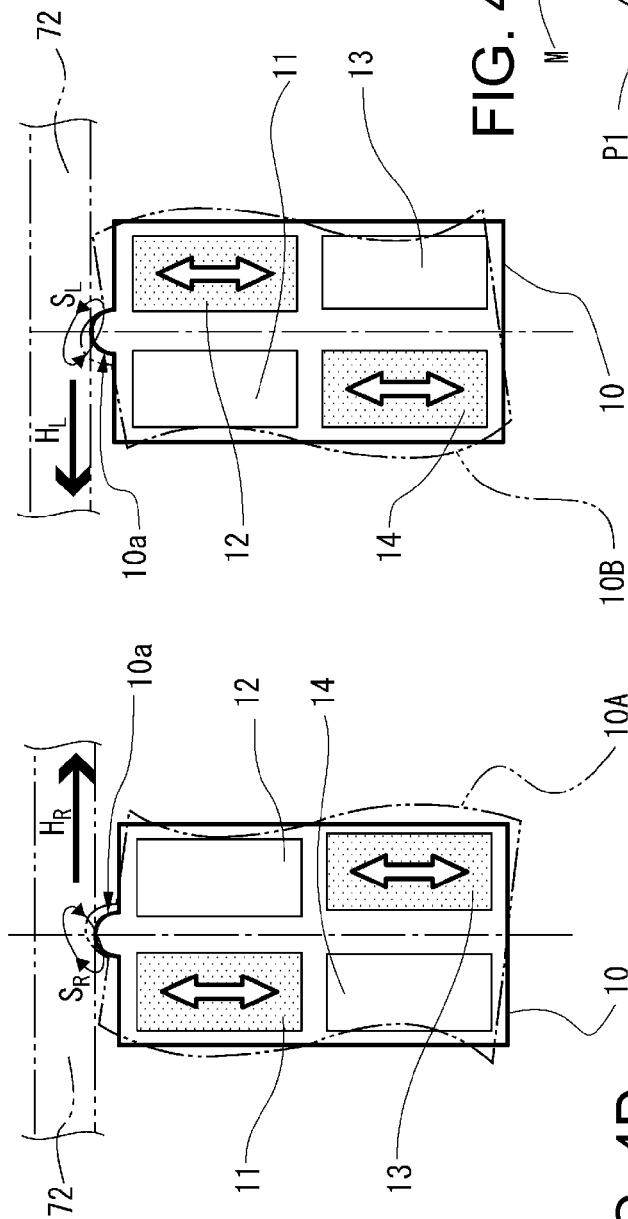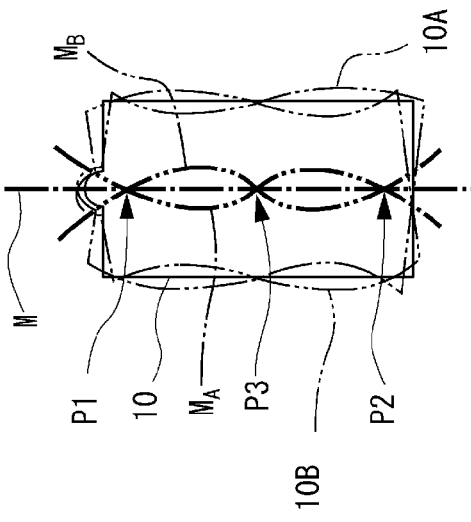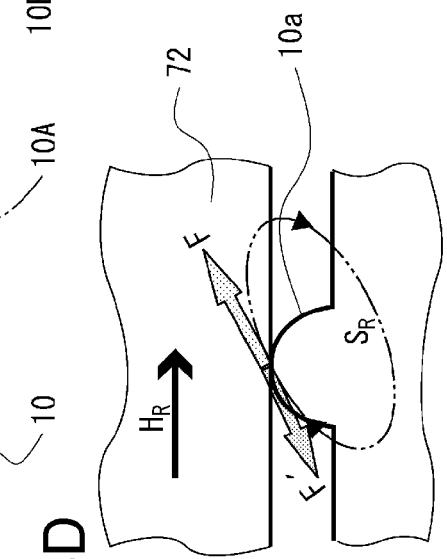

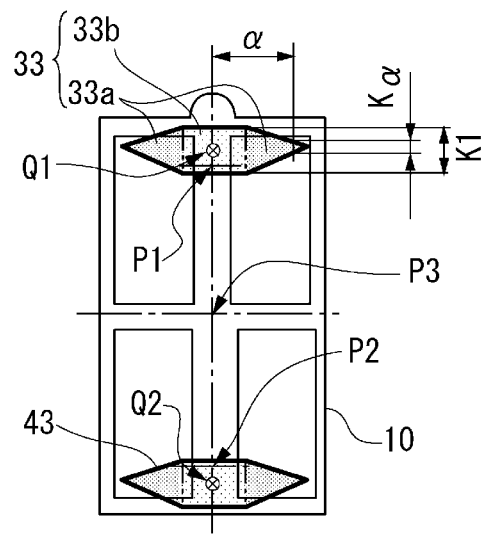
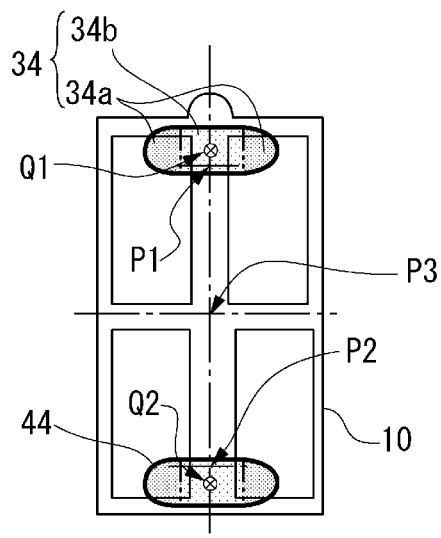
FIG. 6A  FIG. 6B
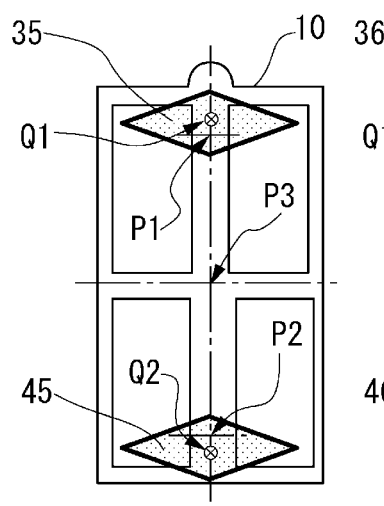
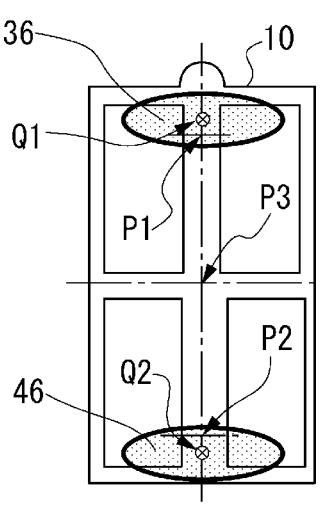
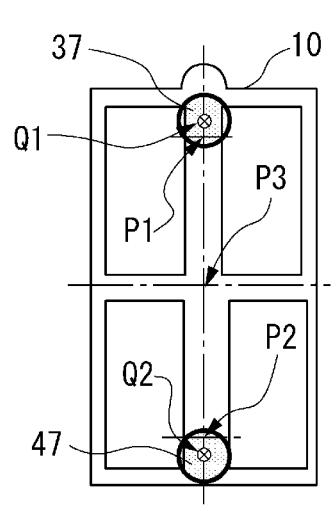
FIG. 6C  FIG. 6D  FIG. 6E

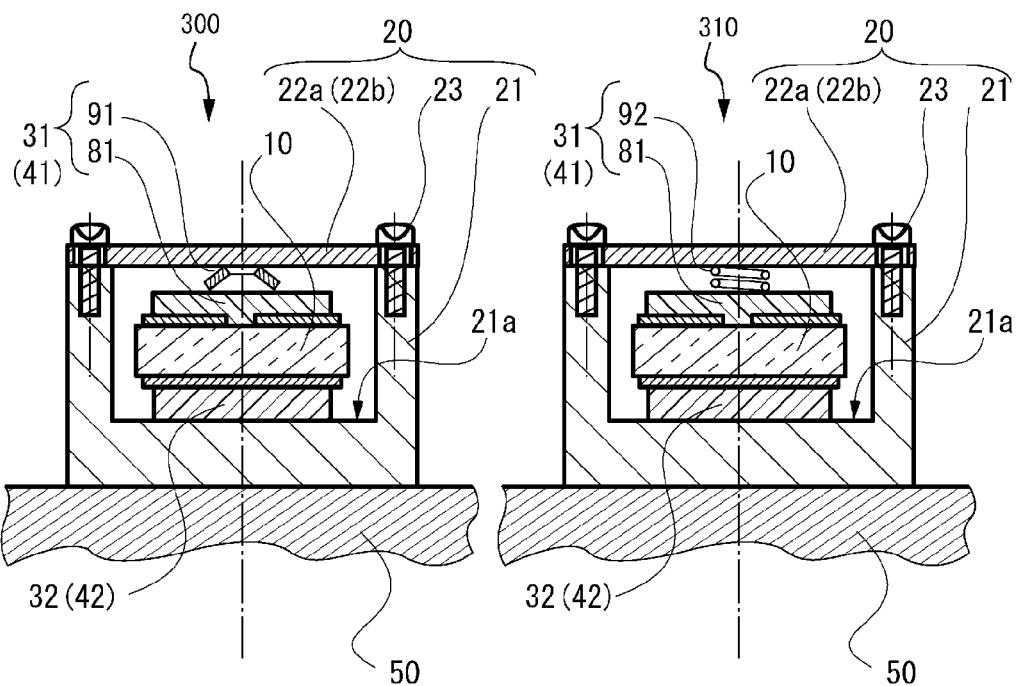

ACTUATOR, ROBOT HAND, ROBOT, ELECTRONIC COMPONENT CARRYING DEVICE, ELECTRONIC COMPONENT INSPECTION DEVICE, AND PRINTER

BACKGROUND

1. Technical Field

The present invention relates to an actuator, a robot hand, a robot, an electronic component carrying device, an electronic component inspection device, and a printer.

2. Related Art

A method of driving an actuator according to the related art includes a method of exciting a piezoelectric body in two vibration modes, setting a protrusion provided at an end portion of the piezoelectric body with an elliptic orbit, and driving a driven unit which comes in contact with the protrusion portion in a predetermined direction. In this actuator, in order to bias the piezoelectric body to the driven unit, a side surface side of a vibrating surface of the piezoelectric body is pressed and held in a holding case with an elastic member, and the holding case is biased in a direction of the driven body by a biasing unit, so that the piezoelectric body is biased to the driven body (Pamphlets of International Publication WO 2007/80851 and WO 2008/93799). In an alternate configuration disclosed in JP-A-2007-189900, a part of an outer edge portion of a piezoelectric body is held, a holding case which holds the piezoelectric body is biased with respect to a driven body, and the piezoelectric body is biased toward the driven body.

However, in Pamphlets of International Publication WO 2007/80851 and WO 2008/93799, since the elastic member which holds the piezoelectric body is disposed so as to limit a vibration in a vibration direction of the piezoelectric body, particularly with respect to a bending vibration, there is a concern that the vibration of the piezoelectric body is leaked to the holding case through the elastic member and a considerable amount of driving energy of the driven body is lost. In JP-A-2007-189900, there is a concern that vibration leakage is generated from a guide unit of the holding case which holds the piezoelectric body and a considerable amount of driving energy of the driven body is lost.

SUMMARY

An advantage of some aspects of embodiments of the invention is to provide an actuator that suppresses vibration leakage of a piezoelectric body to a holding case while holding the piezoelectric body by the holding case, and to reliably convert vibration of the piezoelectric body into vibration of a driven body.

The invention can be implemented in at least the following forms or application examples.

APPLICATION EXAMPLE 1

This application example is directed to an actuator including: a piezoelectric element that vibrates by exciting a bending vibration mode, or vibrates by exciting the bending vibration mode and a longitudinal vibration mode at the same time; a driven body that comes in contact with a contacting portion included in the piezoelectric element, and is driven by a vibration of the contacting portion; a holding unit that holds the piezoelectric element; and a base that includes a biasing unit which biases the holding unit to the driven body, in which the holding unit is disposed in a direction intersecting a vibrating surface of the piezoelectric element, and includes a first support unit and a second support unit which are disposed on one side of the piezoelectric element, a third support unit which is opposed to the first support unit through the piezoelectric element and is disposed on the other side of the piezoelectric element, and a fourth support unit which is opposed to the second support unit through the piezoelectric element and is also disposed on the other side.

According to the actuator of this application example, in a region including a node which is disposed in a position where amplitude in the vibrating surface in a vicinity of a protrusion portion is small, since the piezoelectric element is held by a holding member by the first support unit and the third support unit, it is possible that movement of the piezoelectric element by a reactive force from the driven body to the protrusion portion is suppressed in the vicinity of the protrusion portion, while driving the bending vibration of the piezoelectric element without any impediment. In addition, in a region which is a position furthest from the protrusion portion, and which includes a node which is disposed in a position where amplitude in the vibrating surface is small, since the piezoelectric element is held by the holding member by the second support unit and the fourth support unit, it is possible that a moment to be generated in the piezoelectric element by a reactive force from the driven body to the protrusion portion is effectively suppressed, with a node supported by the first support unit and the third support unit as the center, while driving the bending vibration of the piezoelectric element without any impediment. Accordingly, it is possible to realize an actuator which can stably hold the piezoelectric element by the holding member, and reliably drive the driven body.

APPLICATION EXAMPLE 2

This application example is directed to the actuator according to the application example described above, wherein the piezoelectric element is a rectangular substrate in which a length along a direction perpendicular to a bending vibration direction of the bending vibration mode is set as L and a length along the bending vibration direction is set as W, and includes a first support region in which the first support unit and the third support unit support the piezoelectric element, and a second support region in which the second support unit and the fourth support unit support the piezoelectric element, when a distance between a first centroid Q1 of the first support region and a node of vibration P1 which is disposed closest to one end portion of the piezoelectric element in the length L direction is set as a distance D1, and a distance between a second centroid Q2 of the second support region and a node of vibration P2 which is disposed closest to another end portion of the piezoelectric element in the length L direction is set as a distance D2, the distance D1 and the distance D2 satisfy D1≤0.13 L and D2≤0.13 L, and the first support region includes the node of vibration P1 and the second support region includes the node of vibration P2.

According to the actuator of this application example, since the first support region and the second support region are formed as described above, even when the piezoelectric element is interposed between and held by the first support unit, the second support unit, the third support unit and the fourth support unit, it is possible to be free from an impediment to the bending vibration of the piezoelectric element, and suppress a leakage of the vibration to the holding member. "Perpendicular" according to the Application Example means a state of directions intersecting at an angle of substantially 90 degrees to each other, a so-called state of directions approximately perpendicular to each other, including a state of directions intersecting at an angle of 90 degrees to each other, a so-called state of directions completely perpendicular to each other.

APPLICATION EXAMPLE 3

This application example is directed to the actuator according to the application example described above, wherein the outer edge portion of the first support region and the second support region is provided on the inner side with respect to an outer edge portion of the vibrating surface of the piezoelectric element.

According to this application example, since the first support region and the second support region are formed as described above, even when the piezoelectric element is interposed between and held by the first support unit, the second support unit, the third support unit and the fourth support unit, it is possible to avoid an impediment to the bending vibration of the piezoelectric element, and suppress a leakage of the vibration to the holding member.

APPLICATION EXAMPLE 4

This application example is directed to the actuator according to the application example described above, wherein at least one of first support region and the second support region has a rectangular shape.

According to this application example, as long as the support region formed in the vicinity of the protrusion portion is in a rectangular shape, it is possible that movement of the piezoelectric element by a reactive force from the driven body to the protrusion portion is reliably suppressed in the vicinity of the protrusion portion. In addition, as long as the support region formed in a position furthest from the protrusion portion is in a rectangular shape, it is possible that a moment to be generated in the piezoelectric element by a reactive force from the driven body to the protrusion portion is reliably suppressed. Accordingly, it is possible to realize an actuator which can stably hold the piezoelectric element by the holding member, and reliably drive the driven body.

APPLICATION EXAMPLE 5

This application example is directed to the actuator according to the application example described above, wherein at least one of the first support region and the second support region includes a first region in which a width along a direction perpendicular to the bending vibration direction gradually becomes smaller than a width of the longitudinal vibration mode including the first centroid Q1 or the second centroid Q2 in the longitudinal vibration direction as separating from the first centroid Q1 or the second centroid Q2 in the bending vibration direction.

According to this application example, by forming the support regions as described above, since portions of the support regions where a region width including the centroids Q1 and Q2 is large are disposed in nodes P1 and P2 in which the amplitude of bending vibration is small, a strong supporting force of the piezoelectric element is secured. Since the first region in which a width of the support region becomes small is disposed as getting closer to an outline of the piezoelectric element in the bending vibration direction in which an amplitude of bending vibration becomes larger than the regions of the nodes P1 and P2, it is easy to follow the bending vibration towards to an outline portion in which the amplitude of the piezoelectric element becomes large, while realizing an increase of a holding force of the piezoelectric element, and it is possible to alleviate an impediment to the vibration and to form an indication region. Accordingly, it is possible to realize an actuator which can obtain a specific bending vibration while reliably holding the piezoelectric element, and reliably drive the driven body. "Perpendicular" according to the Application Example means a state of directions intersecting at an angle of substantially 90 degrees to each other, a so-called state of directions approximately perpendicular to each other, including a state of directions intersecting at an angle of 90 degrees to each other, a so-called state of directions completely perpendicular to each other.

APPLICATION EXAMPLE 6

This application example is directed to the actuator according to the application example described above, which further includes: a rectangular second region that includes the first centroid Q1 or the second centroid Q2; and the first region that extends to the second region.

According to this application example, by forming the support regions as described above, since rectangular portions of the support regions where a region area including the centroids Q1 and Q2 is large are disposed in nodes P1 and P2 in which amplitude of bending vibration is small, a strong supporting force of the piezoelectric element is secured.

APPLICATION EXAMPLE 7

This application example is directed to the actuator according to the application example described above, wherein at least one of the first support unit and the third support unit and at least one of the second support unit and the fourth support unit include a buffer unit.

According to this application example, since at least one of the first support unit and the third support unit and at least one of the second support unit and the fourth support unit which include a buffer unit to interpose the piezoelectric element in a direction intersecting the vibrating surface, are provided, it is possible to suppress a leakage of vibration of the piezoelectric element to the holding material. Accordingly, the vibration of the piezoelectric element generates oscillation of the contacting portion without any leakage, and it is possible to be converted into the rotation or a linear movement of the driven body which comes in contact with the contacting portion. That is, it is possible to obtain an actuator having a high driving efficiency. Since the vibration in the vibrating surface direction is allowed as a vibration displacement, it is possible that the buffer material of the buffer unit maintains the vibration necessary for the driving of the driven body. Further, in the regions including the nodes, the vibration displacement is distributed, but by allowing this, it is possible to maintain the vibration desired for the driving of the driven body. That is, it is possible to obtain an actuator having high driving efficiency.

APPLICATION EXAMPLE 8

This application example is directed to the actuator according to the application example described above, wherein at least one of the first support unit and the third support unit and at least of one of the second support unit and the fourth support unit include an elastic portion.

According to this application example, since the elastic portion is disposed on at least one of the first support unit and the third support unit and at least of one of the second support unit and the fourth support unit, it is possible that a relative position shift between the holding member and the piezoelectric element by the vibration is suppressed by a friction force between the holding member and the piezoelectric element with respect to the elastic force of the elastic portion.

APPLICATION EXAMPLE 9

This application example is directed to a robot hand including the actuator according to the application example described above.

According to the robot hand according to this application example, even though many motors are included for many degrees of freedom of motion, it is possible to realize small size and light weight compared to electromagnetic motors or the like.

APPLICATION EXAMPLE 10

This application example is directed to a robot including the actuator or the robot hand according to the application example described above.

According to the robot according to this application example, since driving is performed by the actuator with high driving resolution and high speed vibration, it is possible to reliably hold an operating target, to reliably carry to an objective position with high speed, to shorten operating time of the robot and to realize high productivity. In addition, it is possible to realize a complicated assembly operation or the like of an electronic device.

APPLICATION EXAMPLE 11

This application example is directed to an electronic component carrying device including the actuator according to the application example described above.

According to the electronic component carrying device according to this application example, since it is driven by the actuator with high driving resolution and high speed vibration, it is possible to carry the electronic component or the like to a correct position, and shorten inspection time and assembly time of the electronic component. In addition, it is possible to realize a complicated assembly operation or the like of an electronic device.

APPLICATION EXAMPLE 12

This application example is directed to an electronic component inspection device including the actuator or the electronic component carrying device according to the application example described above.

According to the electronic component inspection device according to this application example, since the actuator or the electronic component carrying device with high driving resolution and high speed vibration is included, it is possible to carry the electronic component of an inspection target to a correct position with high speed, and shorten inspection time and assembly time of the electronic component.

APPLICATION EXAMPLE 13

This application example is directed to a printer including the actuator according to the application example described above.

According to the printer according to this application example, since the actuator with high driving resolution and high speed vibration is included in the driving device unit, it is possible to reliably move a driving object to an objective position with high speed, to shorten operating time of the printer, and to realize high productivity. In addition, since the driving is performed with high speed, it is possible that a driving of a cutter which performs long linear driving and cuts a printing medium is smoothly performed.

BRIEF DESCRIPTION OF THE DRAWINGS

The invention will be described with reference to the accompanying drawings, wherein like numbers reference like elements.

FIG. 1A is a view of an actuator according to a first embodiment, FIG. 1B is a cross-sectional view taken along line A-A' shown in FIG. 1A of an actuator according to a first embodiment, and FIG. 1C is a cross-sectional view taken along lines B-B' or C-C' shown in FIG. 1A of an actuator according to a first embodiment.

FIGS. 4A to 4D are explanatory views of vibrating motions of a piezoelectric element according to a first embodiment.

FIGS. 6A to 6E are conceptual views showing other aspects of support regions of a piezoelectric element according to a first embodiment.

FIGS. 9A to 9D are partial cross-sectional views of an actuator according to a second embodiment.

DESCRIPTION OF EXEMPLARY EMBODIMENTS

Figure 2A:
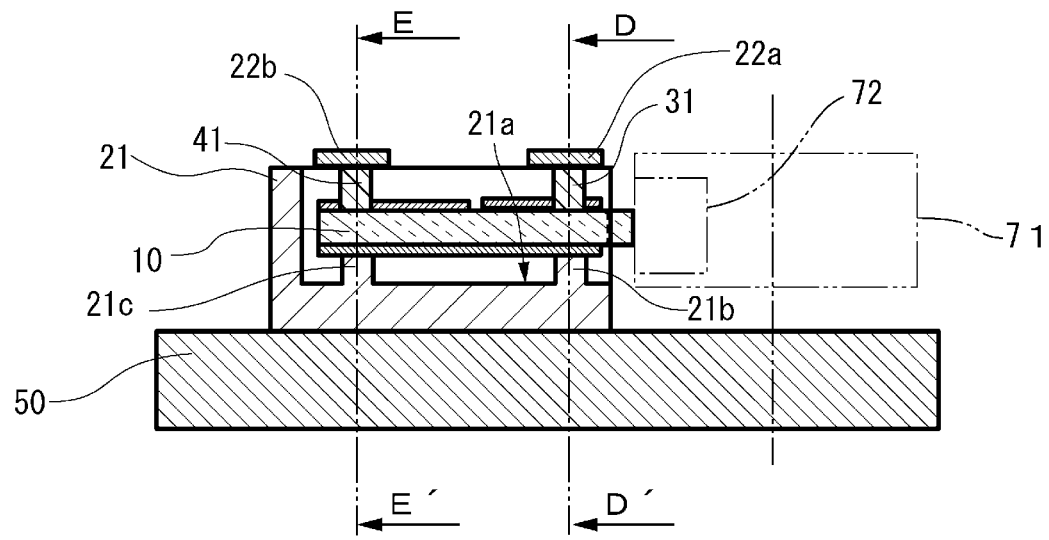
FIG. 2A is a cross-sectional view showing other aspects of an actuator according to a first embodiment.

Hereinafter, embodiments according to the invention will be described referring to the drawings.

First Embodiment

FIG. 1A is a view of an actuator according to a first embodiment, FIG. 1B is a cross-sectional view taken along line A-A' shown in FIG. 1A of the actuator according to the first embodiment, and FIG. 1C is a cross-sectional view taken along lines B-B' or C-C' shown in FIG. 1A of the actuator according to the first embodiment. As shown in FIG. 1A, an actuator 100 includes a holding case 20 as a holding member, a piezoelectric element 10 held by the holding case 20, a base 50 including a spring fixing portion 50a on which a spring 60 is mounted as a biasing unit of the holding case 20, and a driven body 71 or a driven body 72.

The driven body 71 is rotatably driven in an R direction shown in the drawing, and the driven body 72 is linearly driven in an H direction shown in the drawing. The actuator 100 according to the embodiment will be described with the linear driving in the H direction shown by the driven body 72, however a driven body 71 which is rotatably driven may be employed. In the driven body 72, a biasing portion 20a of the holding case 20 is biased by the spring 60 with respect to the spring fixing portion 50a included in the base 50, and the piezoelectric element 10 is biased by the biased holding case 20. The piezoelectric element 10 includes a protrusion portion 10a including a contacting portion which comes in contact with the driven body 72. The protrusion portion 10a oscillates in an elliptic orbit by the vibration of the piezoelectric element 10, and the driven body 72 is linearly driven in the H direction by the elliptic motion.

As shown in FIGS. 1B and 1C, the holding case 20 includes a case main body 21, and pressing plates 22a and 22b fixed to the case main body 21 using a screw 23. The piezoelectric element 10 is disposed between a supporting surface 21a of the case main body 21 and the pressing plates 22a and 22b. The piezoelectric element 10 is interposed between a third support unit 32 and a fourth support unit 42 which are disposed between the piezoelectric element 10 and the supporting surface 21a of the holding case 20, and a first support unit 31 which is disposed between the piezoelectric element 10 and the pressing plate 22a and disposed to be opposed to the third support unit 32 through the piezoelectric element 10 and a second support unit 41 which is disposed between the piezoelectric element 10 and the pressing plate 22b and disposed to be opposed to the fourth support unit 42 through the piezoelectric element 10, and held by and fixed to the holding case 20.

The support units 31, 32, 41, and 42 are formed of buffer material, and suppress a leakage of the vibration of the piezoelectric element 10 to the holding case 20. As the buffer material forming the support units 31, 32, 41, and 42, in a viewpoint of preventing leakage of the vibration excited in the piezoelectric element 10 to the holding case 20, dynamic viscoelasticity (tan δ) is preferred to be equal to or less than 0.05. If sine wave distortion ϵ is applied to a material in a tension mode, among the generation of stress σ generated in the material, a phase δ lag with respect to the input distortion is generated. The quantification of dynamic viscosity of the material using this phase δ is performed to obtain the dynamic viscoelasticity (tan δ). That is, the great dynamic viscoelasticity, which is, the large phase δ means that a transfer lag of the applied distortion is generated inside the material. In other words, it is possible to further delay the transfer of the vibration to suppress the vibration leakage to the holding case 20. As the buffer material forming the support units 31, 32, 41, and 42, for example, rubber, elastomer, polyimide, polyether sulfone, or the like is preferably used, however, since heat is likely generated by the driving of the actuator 100, a polyimide which is superior in heat resistance can be more preferably used.

Figure 2B:
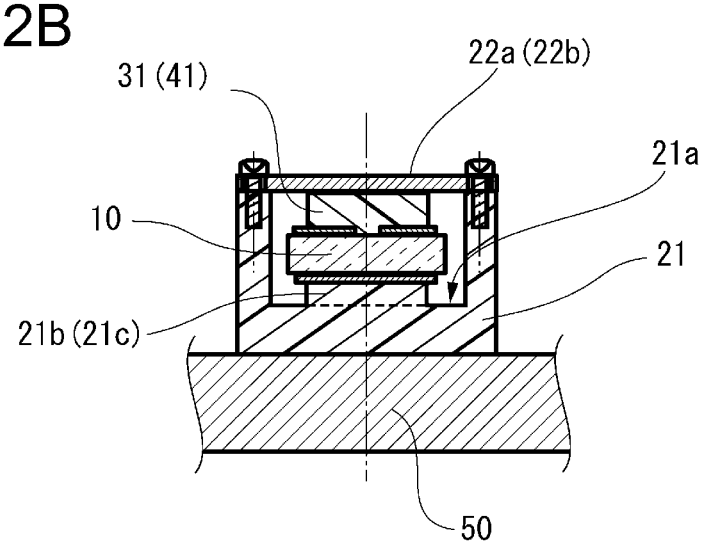
FIG. 2B is a cross-sectional view taken along lines D-D' or E-E' shown in FIG. 2A showing other aspects of an actuator according to a first embodiment.

It is preferable to configure the support units 31, 32, 41, and 42 by the buffer material; however, it is not limited thereto. For example, the support units 32 and 42 shown in FIGS. 1A to 1C may be as shown in FIGS. 2A and 2B. FIG. 2A is a cross-sectional view taken along line A-A' showing a cross-sectioned portion shown in FIG. 1A, and FIG. 2B is a cross-sectional view taken along lines D-D' or E-E' shown in FIG. 2A. As shown in FIGS. 2A and 2B, a configuration having support protrusions 21b and 21c formed on the supporting surface 21a of the case main body 21, the piezoelectric element 10 interposed between the support protrusion 21b and the support unit 31 formed by the buffer material, and the piezoelectric element 10 interposed between the support protrusion 21c and the support unit 41 formed by the buffer material, may be used.

Figures 3A, 3B, 3C:
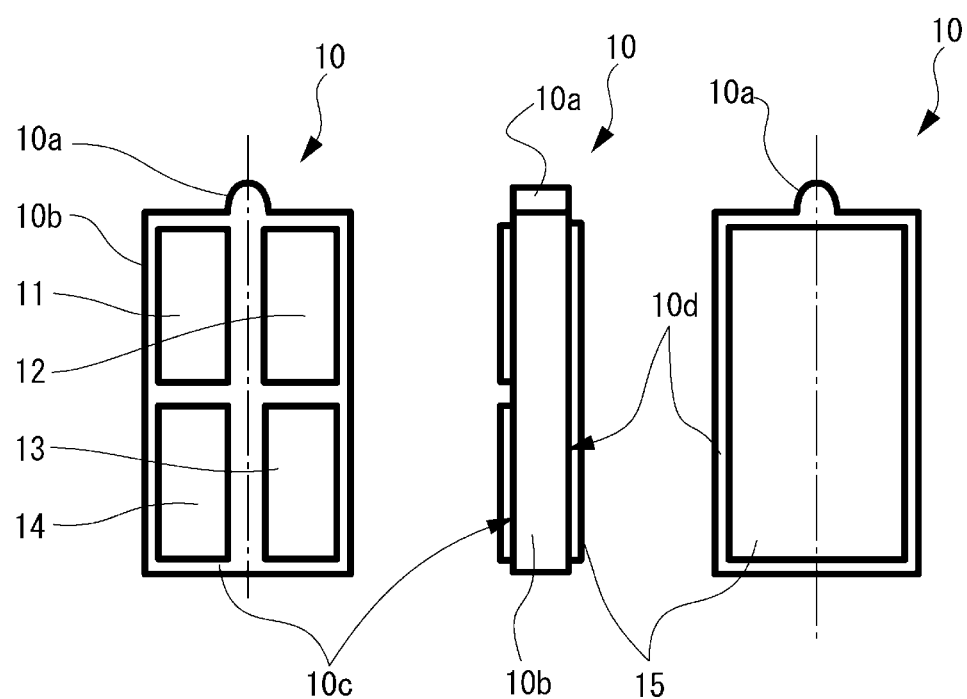
FIG. 3A is a front view showing an electrode disposition of a piezoelectric element according to a first embodiment.
FIG. 3B is a side view showing an electrode disposition of a piezoelectric element according to a first embodiment.
FIG. 3C is a rear view showing an electrode disposition of a piezoelectric element according to a first embodiment.

FIG. 3A is a front view showing the aspect of the piezoelectric element 10, FIG. 3B is a side view showing the aspect of the piezoelectric element 10, and FIG. 3C is a rear view showing the aspect of the piezoelectric element 10. As shown in FIG. 3A, in the piezoelectric element 10, electrodes 11, 12, 13, and 14 which excite a bending vibration are formed on one surface 10c of a piezoelectric body 10b. In addition, a common electrode 15 is formed on another surface 10d. As the piezoelectric body 10b, there is no limitation as long as a material having piezoelectricity is used; however, PZT (piezoelectric zirconate titanate) is preferably used. As the electrodes, there is no limitation as long as conductive metal is used; however, for example, Al, Au, Ag, W, Cu and the like are used and formed by a method such as a sputtering method or a deposition method. In addition, since the protrusion portion 10a comes in contact with the driven body 72 and drives the driven body 72 by friction, the protrusion portion 10a is formed by a material having high coefficient of friction with the driven body 72 and superior abrasion resistance, and is formed by bonding with a method not shown. Alternatively, the protrusion portion can be formed by coating a material having high coefficient of friction on the driven body 72 and superior abrasion resistance on the surface of the protrusion portion 10a integrally formed with the piezoelectric body 10b. As the material having superior abrasion resistance used for the protrusion portion 10a, ceramic or alumina, for example, are preferably used.

FIGS. 4A to 4D are views schematically illustrating motions of the piezoelectric element 10. As shown in FIG. 4A, by applying an electric charge between the electrodes 11 and 13 and the common electrode 15 shown in FIGS. 3A to 3C, and not applying an electric charge to the electrodes 12 and 14, a longitudinal vibration of arrows shown in the drawing is excited in portions corresponding to the electrodes 11 and 13 of the piezoelectric element 10. However, since no electric charge is applied to the electrodes 12 and 14, the longitudinal vibration is not excited. As a result, by the longitudinal vibration by the electrodes 11 and 13, and non-vibration of the electrodes 12 and 14, the bending vibration of the piezoelectric element 10 is generated and the piezoelectric element 10 vibrates like a piezoelectric element 10A, and the protrusion portion 10a oscillates in an arrow direction of an elliptic orbit $S_R$ shown in the drawing. The oscillation of the protrusion portion 10a in the $S_R$ direction by the elliptic orbit drives the abutted driven body 72 in an $H_R$ direction shown in the drawing.

A motion of the piezoelectric element 10 to be described in FIG. 4B is in a state where the driven body is driven in an $H_L$ direction which is opposite to the driving direction of the driven body 72 which is in the $H_R$ direction described in FIG. 4A. As shown in FIG. 4B, by applying an electric charge between the electrodes 12 and 14 and the common electrode 15 shown in FIGS. 3A to 3C, and not applying an electric charge to the electrodes 11 and 13, a longitudinal vibration of arrows shown in the drawing is excited in portions corresponding to the electrodes 12 and 14 of the piezoelectric element 10. However, since no electric charge is applied to the electrodes 11 and 13, the longitudinal vibration is not excited. As a result, by the longitudinal vibration by the electrodes 12 and 14, and non-vibration of the electrodes 11 and 13, the bending vibration is generated, the piezoelectric element 10 vibrates like a piezoelectric element 10B, and the protrusion portion 10a oscillates in an arrow direction of an elliptic orbit $S_L$ shown in the drawing. The oscillation of the protrusion portion 10a in the $S_L$ direction by the elliptic orbit drives the abutted driven body 72 in an $H_L$ direction shown in the drawing.

As described above, by switching the application of the electric charge to the electrodes 11, 12, 13, and 14, it is possible to change the direction of the bending vibration of the piezoelectric element 10 and easily switch the driving direction of the driven body 72. Nodes of the vibration in the two vibration modes of the bending vibration and the longitudinal vibration of the piezoelectric element 10 described above will be described using FIG. 4C. FIG. 4C shows a conceptual view of the vibration modes of the piezoelectric element 10. As shown in FIG. 4C, the piezoelectric element 10 is in the vibration states shown in the piezoelectric elements 10A and 10B by the bending vibration mode of the vibration state described using FIGS. 4A and 4B. At this time, a line M which is along the biasing direction of the piezoelectric element 10 in a non-vibration state to the driven body 72, and which is a center line in the piezoelectric element 10 according to the embodiment, becomes orbitally bent like a line $M_A$ in the piezoelectric element 10A of the vibration state and a line $M_B$ in the piezoelectric element 10B of the vibration state. Positions in which the line $M_A$ and the line $M_B$ corresponding to the bending vibration and the line M corresponding to the longitudinal vibration mode intersect to each other, are called nodes of vibration P1, P2 and P3 (hereinafter, referred to as nodes P1, P2 and P3).

Since the nodes P1, P2, and P3 are positions with less movement in the vibrating surface, that is, positions with less amplitude in the vibration of the piezoelectric element 10, it is preferable to dispose the support units 31, 32, 41, and 42 in a region including any of nodes P1, P2, and P3, and it is also preferable to dispose the support units 31, 32, 41, and 42 in a region including nodes P1 and P2 which are closest to an outline portion of the piezoelectric element 10 along the line M. The driving of the driven body 72 by the elliptic orbits $S_R$, $S_L$ of the protrusion portion 10a has been described using FIGS. 4A and 4B, and the detail of the contacting portion of the protrusion portion 10a and the driven body 72 when the driven body 72 is driven in the $H_R$ direction as shown in FIG. 4A for example, is shown in FIG. 4D. As shown in FIG. 4D, in the contacting portion of the protrusion portion 10a of the piezoelectric element 10 and the driven body 72, a driving force F is generated by friction of the contacting portion with respect to the driven body 72 by the elliptic orbit $S_R$ by the vibration of the protrusion portion 10a. The driven body 72 is driven in the $H_R$ direction by the driving force F. At this time, F' is generated as a reactive force of the driving force F with respect to the protrusion portion 10a in the contacting portion to move the protrusion portion 10a in a direction opposite to the $H_R$ direction, however, by controlling and suppressing the movement of the protrusion portion 10a, that is the piezoelectric element 10 by the reactive force F', the driving force F is transferred to the driven body 72, and it is possible to effectively convert the bending vibration of the piezoelectric element 10 into the driving of the driven body 72.

At this time, in a region including the node P1 which is disposed in a position where the amplitude is small in the vibrating surface in the vicinity of the protrusion portion 10a, by holding the piezoelectric element 10 in the holding case 20 by the first support unit 31 and the third support unit 32, it is possible to suppress the movement of the protrusion portion 10a by the reactive force F' in the vicinity of the protrusion portion 10a while driving the bending vibration of the piezoelectric element 10 without impediment. In addition, in a region including the node P2 which is disposed in a position furthest from the protrusion portion 10a and a position where the amplitude is small in the vibrating surface, by holding the piezoelectric element 10 in the holding case 20 by the second support unit 41 and the fourth support unit 42, it is possible to effectively suppress moment to be generated in the piezoelectric element 10 by the reactive force F' with the node P1 supported by the first support unit 31 and the third support unit 32 as the center, and control the movement of the protrusion portion 10a by the reactive force F' while driving the bending vibration of the piezoelectric element 10 without impediment.

Even in the case of driving the driven body 72 in the $H_L$ direction as shown in FIG. 4B, by supporting the region including the node P1 by the first support unit 31 and the third support unit 32, and supporting the region including the node P2 by the second support unit 41 and the fourth support unit 42, in the same manner as the description of FIG. 4D described above, in the region including the node P1 which is disposed in the position where the amplitude is small in the vibrating surface in the vicinity of the protrusion portion 10a, by holding the piezoelectric element 10 in the holding case 20 by the first support unit 31 and the third support unit 32, it is possible to suppress the movement of the protrusion portion 10a by the reactive force from the driven body 72 in the vicinity while driving the bending vibration of the piezoelectric element 10 without impediment.

In addition, in a region including the node P2 which is disposed in a position furthest from the protrusion portion 10a and a position where the amplitude is small in the vibrating surface, by holding the piezoelectric element 10 in the holding case 20 by the second support unit 41 and the fourth support unit 42, it is possible to effectively suppress moment to be generated in the piezoelectric element 10 by the reactive force from the driven body 72 with the node P1 supported by the first support unit 31 and the third support unit 32 as the center, and control the movement of the protrusion portion 10a by the reactive force F' while driving the bending vibration of the piezoelectric element 10 without impediment.

Figure 5A:
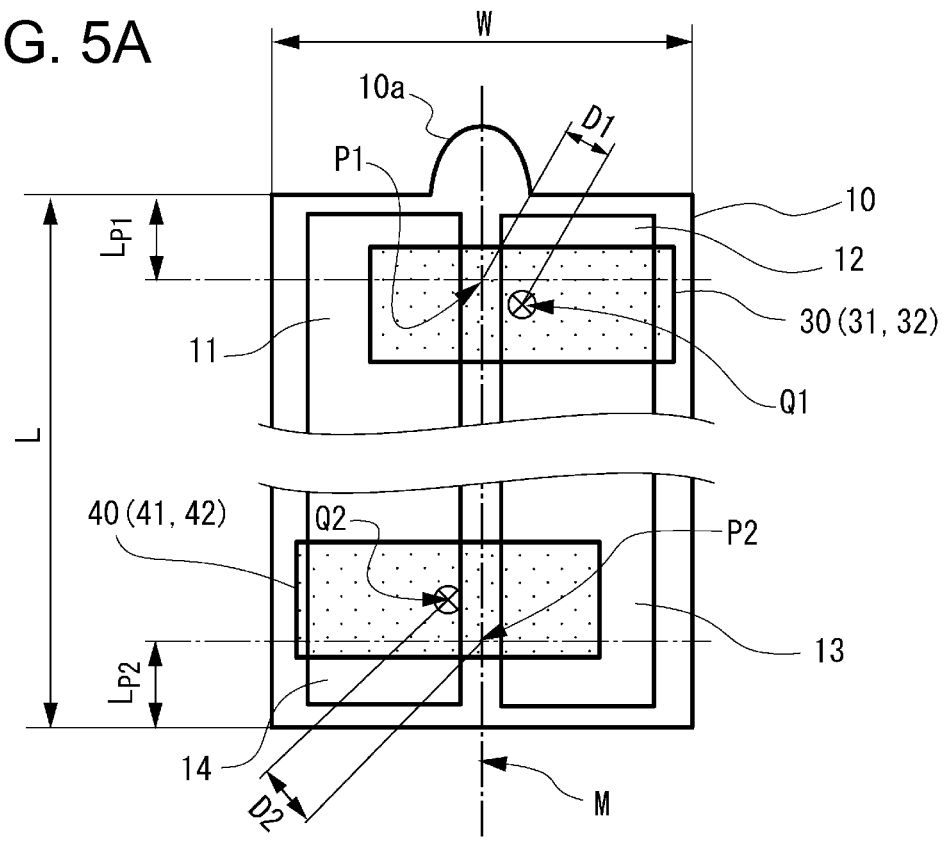
FIGS. 5A and 5B are conceptual views showing an aspect of support regions of a piezoelectric element according to a first embodiment.
Figure 5B:
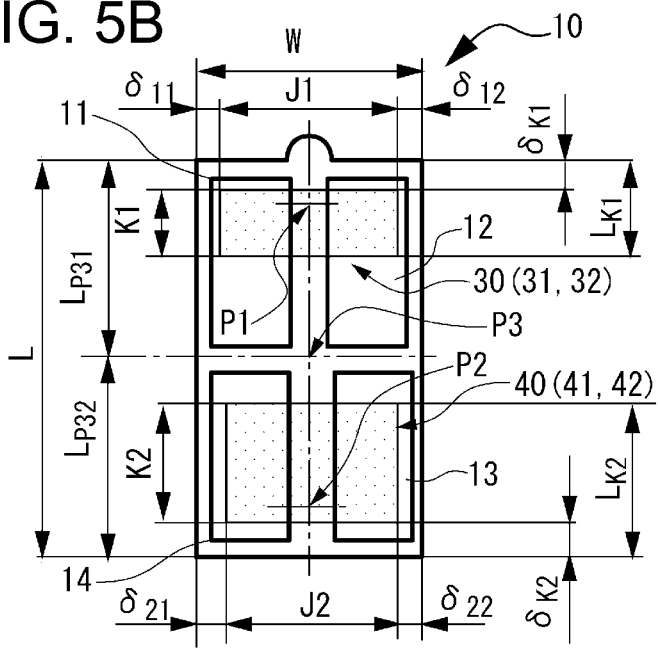

FIGS. 5A and 5B are conceptual views showing an aspect of a shape of a contacting portion, that is the support regions, between the support units 31, 32, 41, and 42 and the piezoelectric element 10. As shown in FIG. 5A, a first support region 30 in the vibrating surface of the piezoelectric element 10 denotes a region where the piezoelectric element 10 is supported by the first support unit 31 and the third support unit 32, and a second support region 40 denotes a region where the piezoelectric element 10 is supported by the second support unit 41 and the fourth support unit 42. The support regions 30 and 40 are formed in rectangular shapes, and centroids of the rectangular shapes thereof are Q1 in the first support region 30 and Q2 in the second support region 40. The piezoelectric element 10 is formed with a length L except the protrusion portion 10a in a direction approximately perpendicular to the bending vibration direction and a width W in the bending vibration direction. The node P1 is provided for a distance $L_{P1}$ from the end portion of the L direction of the piezoelectric element 10 formed as described above on the protrusion portion 10a side, and the node P2 is provided for a distance $L_{P2}$ from another end portion thereof.

It is found that the position $L_{P1}$ of the node P1 and the position $L_{P2}$ of the node P2 satisfy $L_{P1} \approx 0.13$ L and $L_{P2} \approx 0.13$ L from theoretical simulation. Accordingly, it is preferable that a distance D1 between the centroid Q1 and the node P1 of the first support region 30 and a distance D2 between the centroid Q2 and the node P2 of the second support region 40 satisfy D1≤0.13 L and D2≤0.13 L, and it is more preferable that the D1 and D2 get closer to 0. Further, it is preferable that the node P1 is included in the region of the first support region 30 and the node P2 is included in the region of the second support region 40. Since the support regions 30 and 40 are formed as described above, even when the piezoelectric element 10 is interposed between and held by the support units 31, 32, 41, and 42, it is possible to avoid an impediment to the bending vibration of the piezoelectric element 10, and suppress a leakage of the vibration to the holding case 20.

FIG. 5B is a conceptual view illustrating formation regions of the support regions 30 and 40. First, the formation region of the first support region 30 will be described using FIG. 5B. As shown in FIG. 5A described above, by satisfying the distance D1 between the centroid Q1 and the node P1 of the first support region 30≤0.13 L, the first support region 30 is set in a rectangular with a length K1 in the L direction and a width J1 in the W direction, and the first support unit 31 and the third support unit 32 are formed therein. The K1 and the J1 is suitably set by the supporting area of the support region 30 determined by the K1 and the J1, that is, a setting value of a holding force of the piezoelectric element 10 by the first support unit 31 and the third support unit 32. At this time, distances $\delta_{11}, \delta_{12}, \delta_{K1}$ between the outline of the piezoelectric element 10 and the outline portion of the first support region 30 satisfy $\delta_{11}>0$, $\delta_{12}>0$, and $\delta_{K1}>0$. That is, the outline portion of the first support region 30 is formed so as to not overlap the outline portion of the piezoelectric element 10.

In addition, a position $L_{K1}$ of the first support region 30 in the L direction on the second support region 40 side is set as $L_{K1}>L_{P31}$ with respect to a position $L_{P31}$ of the node P3 of the center portion of the piezoelectric element 10.

In the same manner as the first support region 30, also in the second support region 40, a length K2 and a width J2 of the second support region 40 are suitably set by a setting value of the holding force of the piezoelectric element 10 by the second support unit 41 and the fourth support unit 42. In addition, the outline of the piezoelectric element 10 and distances $\delta_{21}$, $\delta_{22}$, $\delta_{K2}$ satisfy $\delta_{21}>0$, $\delta_{22}>0$, $\delta_{K2}>0$. That is, the outline portion of the second support region 40 is formed so as to not overlap the outline portion of the piezoelectric element 10, and a position $L_{K2}$ of the second support region 40 in the L direction on the first support region 30 side is set as $L_{K2}<L_{P32}$ with respect to a position $L_{P32}$ of the node P3 of the center portion of the piezoelectric element 10. That is, the first support region 30 and the second support region 40 are separated with the node P3 interposed therebetween. Since the support regions 30 and 40 are set as described above, even when the piezoelectric element 10 is interposed between and held by the support units 31, 32, 41, and 42, it is possible to avoid an impediment to the bending vibration of the piezoelectric element 10.

FIGS. 6A to 6E are conceptual views showing other aspects of the support regions 30 and 40. Since support regions 33 and 43 shown in FIG. 6A have the same region aspects, the description will be performed using a first support region 33. In the first support region 33, triangular first regions 33a and a rectangular second region 33b are connected and extended. The first regions 33a are disposed so that, as a distance α from the center of the piezoelectric element 10 in the bending vibration direction becomes larger, a length K1 in the L direction gradually becomes smaller. Since the support regions 33 and 43 are formed as described above, the centroids Q1 and Q2 get closer to the nodes P1 and P2 where the amplitude of the bending vibration is small, and the rectangular second region 33b having a large region area is disposed to secure the strong supporting force of the piezoelectric element 10. Since the first regions 33a where the region area becomes smaller as getting closer to the outline of the piezoelectric element 10 in which the amplitude of the bending vibration is larger than the regions of the nodes P1 and P2 in the width W direction, is disposed, it is easy to follow the bending vibration towards to the outline portion in which the amplitude of the piezoelectric element 10 becomes large, while realizing an increase of the holding force of the piezoelectric element 10, and it is possible to alleviate an impediment to the vibration. Accordingly, it is possible to obtain the predetermined bending vibration while reliably holding the piezoelectric element 10, and to reliably drive the driven bodies 71 and 72.

FIG. 6B is a conceptual view showing a support region 34 in which a first region 34a is a semicircular shape, a so-called track shape. In the same manner as the support regions 33 and 43 described above, the first support region 34 shown in FIG. 6B includes a rectangular second region 34b and the semi circular first region 34a which is connected to the second region 34b and extended. In the same manner as the second region 33b described using FIG. 6A, the second region 34b has a support width which gradually becomes narrower towards the outline of the piezoelectric element 10. As described above, as long as the support region has a shape of which the support width gradually becomes narrower towards the outline in the bending vibration direction of the piezoelectric element 10, the shape is not specifically limited, and as other examples, for example, support regions 35 and 45 shown in FIG. 6C may be a so-called rhombus shape, support regions 36 and 46 shown in FIG. 6D may be an elliptical shape, or the support regions 37 and 47 shown in FIG. 6E may be a circular shape.

Figure 7A:
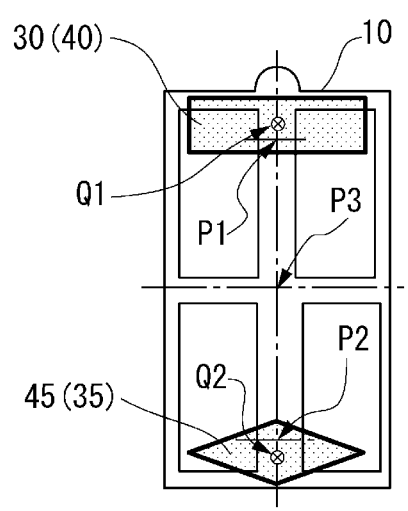
FIGS. 7A and 7B are conceptual views showing other aspects of support regions of a piezoelectric element according to a first embodiment.
Figure 7B:
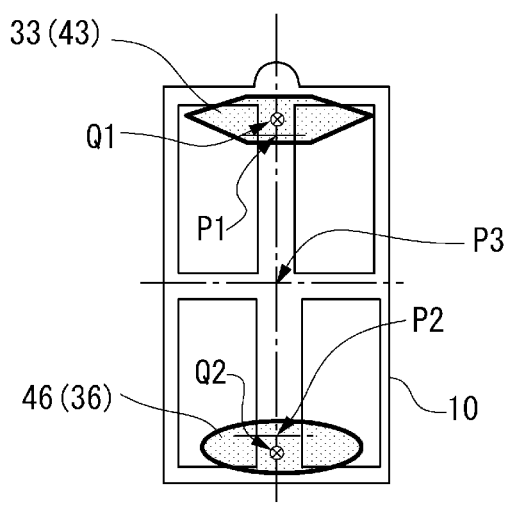

The aspects of the support regions 30 and 40 described using FIGS. 1A to 1C, FIGS. 5A and 5B, and FIGS. 6A to 6E above can also be used by combining each planar shape of the support regions 30 and 40, as shown in FIGS. 7A and 7B. For example, as shown in FIG. 7A, one support region may be the support regions 30 and 40 having a rectangular shape, and another support region may be the support regions 35 and 45 having a rhombus shape shown in FIG. 6C. In addition, as shown in FIG. 7B, one support region may be the support regions 33 and 43 having the aspect shown in FIG. 6A, and another support region may be the support regions 36 and 46 having an elliptical shape shown in FIG. 6D.

Figure 8A:
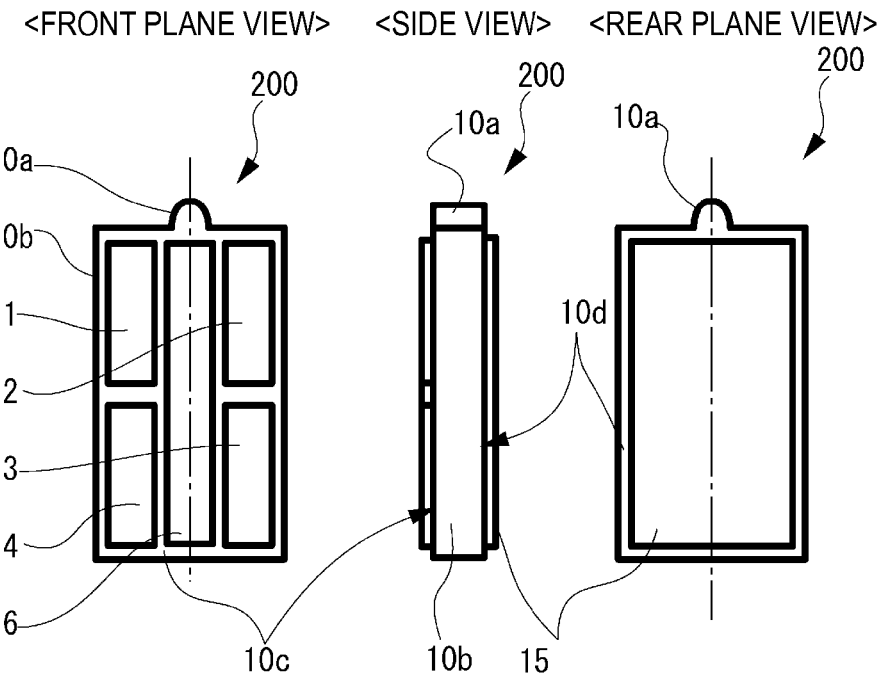
FIG. 8A includes a front view, side view, and a rear view showing other aspects of a piezoelectric element.
Figure 8B:
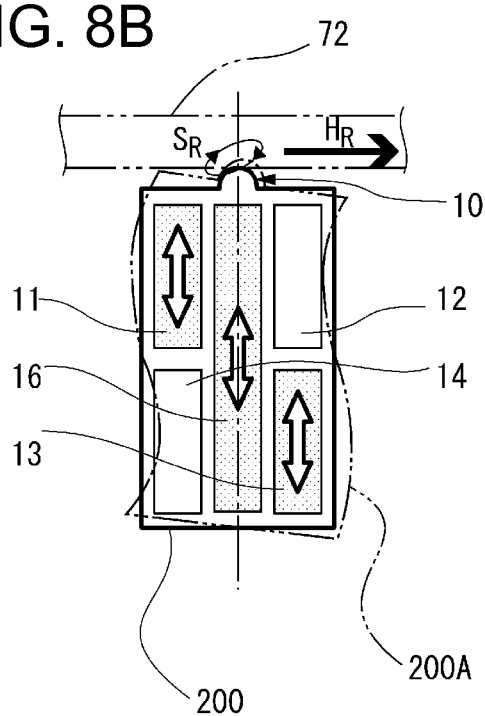
FIGS. 8B and 8C are explanatory views of vibrating motions of a piezoelectric element.
Figure 8C:
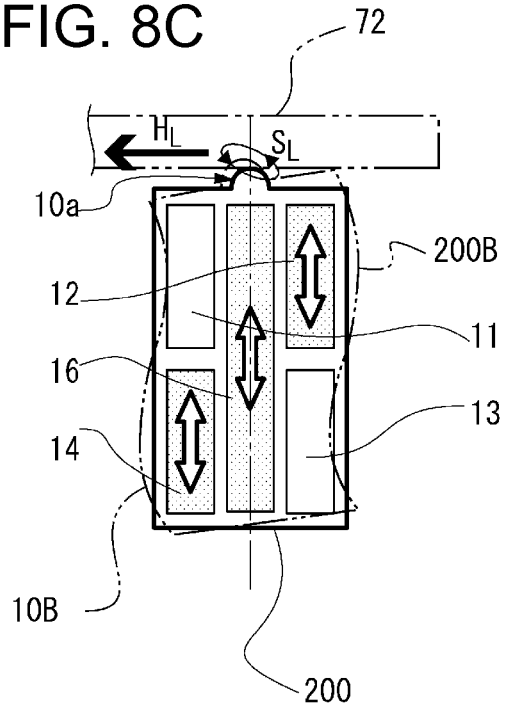

The actuator 100 according to the embodiment may use a piezoelectric element 200 shown in FIGS. 8A to 8C. FIG. 8A includes a front view, side view, and a rear view showing electrode disposition, and FIGS. 8B and 8C are conceptual views describing bending motions of the piezoelectric element 10A. The piezoelectric element 200 has a different aspect of disposition of electrodes compared to the piezoelectric element 10, and constituent elements having the same configuration as the piezoelectric element 10 have the same reference numerals and the description thereof will be omitted.

As shown in FIG. 8A, in the piezoelectric element 200, the electrodes 11, 12, 13, and 14 which excite the bending vibration and an electrode 16 which excites the longitudinal vibration are formed on the one surface 10c of the piezoelectric body 10b. In addition, the common electrode 15 is formed on the other surface 10d. Then, the piezoelectric element 200 formed as described above operates as shown in FIGS. 8B and 8C. FIGS. 8B and 8C are views schematically describing the motion of the piezoelectric element 200. As shown in FIG. 8B, by applying an electric charge between the electrodes 11, 13, and 16, and the common electrode 15 shown in FIG. 8A, and not applying an electric charge to the electrodes 12 and 14, the longitudinal vibration of arrows shown in the drawing is excited in portions corresponding to the electrodes 11, 13, and 16 of the piezoelectric element 200. However, since no electric charge is applied to the electrodes 12 and 14, the longitudinal vibration is not excited. As a result, by the longitudinal vibration by the electrodes 11 and 13, and non-vibration of the electrodes 12 and 14, the bending vibration is generated, the piezoelectric element 200 vibrates like a piezoelectric element 200A. This bending vibration and the longitudinal vibration of the piezoelectric element 200 by the electrode 16 are generated at the same time, and the protrusion portion 10a oscillates in the arrow direction of the elliptic orbit $S_R$ shown in the drawing. The oscillation of the protrusion portion 10a in the $S_R$ direction by the elliptic orbit drives the abutted driven body 72 in an $H_R$ direction shown in the drawing.

A motion of the piezoelectric element 200 to be described in FIG. 8C is in a state where the driven body is driven in an $H_L$ direction which is opposite to the driving direction of the driven body 72 which is in the $H_R$ direction described in FIG. 8B described above. As shown in FIG. 8C, by applying an electric charge between the electrodes 12, 14, and 16, and the common electrode 15 shown in FIG. 8A, and not applying an electric charge to the electrodes 11 and 13, a longitudinal vibration of arrows shown in the drawing is excited in portions corresponding to the electrodes 12, 14 and of the piezoelectric element 200. However, since no electric charge is applied to the electrodes 11 and 13, the longitudinal vibration is not excited. As a result, by the longitudinal vibration by the electrodes 12 and 14, and non-vibration of the electrodes 11 and 13, the bending vibration is generated, the piezoelectric element 200 vibrates like a piezoelectric element 200B. This bending vibration and the longitudinal vibration of the piezoelectric element 200 by the electrode 16 are generated at the same time, and the protrusion portion 10a oscillates in the arrow direction of the elliptic orbit $S_L$ shown in the drawing. The oscillation of the protrusion portion 10a in the $S_L$ direction by the elliptic orbit drives the abutted driven body 72 in an $H_L$ direction shown in the drawing.

Second Embodiment

FIGS. 9A to 9D are schematic cross-sectional views taken along lines B-B' and C-C' shown in FIG. 1A, of a support unit of an actuator according to a second embodiment. The actuator according to the second embodiment is different from the actuator 100 according to the first embodiment in a point in which the support unit 31, 32, 41, and 42 includes an elastic member, and other configurations are the same. The constituent elements having the same configuration as the actuator 100 according to the first embodiment have the same reference numerals and the description thereof will be omitted.

An actuator 300 shown in FIG. 9A includes a disc spring 91 as the elastic member and a buffer member 81 in the first support unit 31 and the second support unit 41. The piezoelectric element 10 is interposed between the third support unit 32 and the fourth support unit 42, and the buffer member 81, and the disc spring 91 is disposed between the pressing plates 22a and 22b, and the supporting surface 21a of the case main body 21. The piezoelectric element 10 is held by and fixed to the holding case 20 through the third support unit 32, the fourth support unit 42, and the buffer member 81, due to a spring force of the disc spring 91 which is disposed and pressed between the pressing plates 22a and 22b and the buffer member 81. Since it is possible to provide a holding force of the piezoelectric element 10 with stable spring elasticity of the elastic member to the support unit by disposing the elastic member such as the disc spring 91 on the support unit as described above, it is possible to suppress an impediment to the bending vibration of the piezoelectric element 10 and generation of the vibration leakage, and to obtain the actuator generating the stable driving force.

The aspect of providing the elastic member to the support unit is not limited to the disc spring 91 shown in FIG. 9A described above, and for example, an actuator 310 which includes a coil spring 92 as shown in FIG. 9B may be used. In addition, as shown in FIG. 9C, an actuator 320 which includes the disc spring 91 as the elastic member in the first support unit 31 and the second support unit 41 and further includes the disc spring 91 in the third support unit 32 and the fourth support unit 42, may be used. By disposing the disc springs 91 on both side of the support units 31, 32, 41, and 42 as described above, it is possible to apply a pressing force to the piezoelectric element 10 through the buffer members 81 and 82 in a balanced manner.

As described above, the disc spring 91 and the coil spring 92 has been used as the example of the elastic member, however, for example, as shown in FIG. 9D, when all of the support units 31, 32, 41, and 42 are formed of the buffer materials, and the piezoelectric element 10 is interposed between pressing plates 24a and 24b by the support units 31, 32, 41, and 42 and the supporting surface 21a of the case main body 21, pressing plates 24c and 24d are bent as shown in the drawing such that the pressing plates 24a and 24b are configured as the elastic members due to the stress of the bending. By configuring as described above, since the disc spring 91 or the coil spring 92 as the elastic member is not necessary, it is possible to obtain the actuator 330 with a low cost.

Since the support units 31, 32, 41 and 42 which include the buffer material so as to interpose the piezoelectric element 10 in a direction intersecting the vibrating surface are included, the actuator 100 according to the embodiment can suppress the vibration leakage of the piezoelectric element 10 to the holding case 20. Accordingly, the vibration of the piezoelectric element 10 generates the oscillation of the protrusion portion 10a without any leakage, and it is possible to be converted into the rotation or the linear movement of the driven bodies 71 and 72 which come in contact with the protrusion portion 10a. That is, it is possible to obtain the actuator with high driving efficiency. Further, by disposing the support units 31, 32, 41, and 42 on the region including the nodes of vibration of the piezoelectric element 10, since the region including the nodes of the vibration of the piezoelectric element 10 is the region where the movement due to the vibration of the piezoelectric element 10 is small, that is, the region where the amplitude is small, it is possible to suppress the vibration leakage to the holding case 20. In addition, by disposing the support units 31, 32, 41, and 42 by forming the support regions so as to include the two nodes on the outer side among the nodes of the vibration, since the piezoelectric element 10 is not easily moved with respect to the reactive force from the driven body to the protrusion portion 10a of the piezoelectric element 10, it is possible to reliably transfer the oscillation of the protrusion portion 10a due to the vibration of the piezoelectric element 10 to the driven bodies 71 and 72 abutted to the protrusion portion 10a, and to convert the oscillation into the rotation or the linear movement.

In addition, as the actuators 300, 310, 320, and 330, the buffer member 81 and the support units 31, 32, 41, and 42 formed of the buffer materials are pressed in the holding case 20, by the bending elasticity of the disc spring 91, the coil spring 92, or the pressing plates 24a and 24b as the elastic members provided in the support units 31, 32, 41, and 42, such that it is possible to suppress the relative position shift due to the vibration, by the friction force between the holding case 20 and the piezoelectric element 10 with respect to the reactive force. The support regions of the piezoelectric element 10 of the buffer member 81 or the support units 31, 32, 41, and 42 formed of the buffer materials may be fixed by an adhesive or the like. As the adhesive, for example, an acrylic adhesive such as Cemedine Y611 (trademark) may be applied. This adhesive is excellent in a high temperature, and can secure good extensible movement due to the elasticity of the adhesive resin.

Third Embodiment

Figure 10:
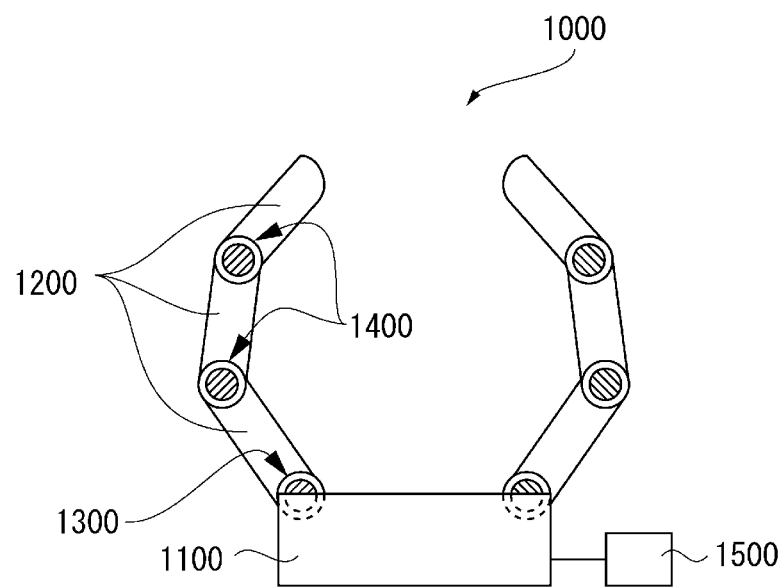
FIG. 10 is an outline view showing a robot hand according to a third embodiment.

FIG. 10 is an outline view showing a robot hand 1000 including the actuator 100 or 300 according to the first embodiment. The actuator 100 included in the robot hand 1000 shown in FIG. 10 is the actuator 100 according to the first embodiment, includes the driven body 71 which is rotatably driven (see FIGS. 1A to 1C), and is used as a rotatably driven motor of a joint portion of the robot hand 1000 will be described later. The robot hand 1000 includes finger portions 1200 connected to a base 1100. The actuators 100 as the rotatably driven motors are embedded in connected portions 1300 between the base 1100 and the finger portion 1200, and in joint portions 1400 of the finger portions 1200. A control unit 1500 is provided on the robot hand 1000, and by the control unit 1500, it is possible to rotate the connected portions 1300 and the joint portions 1400 due to the driving of the actuator 100, and to deform the finger portions 1200 in predetermined forms as fingers of human being.

Fourth Embodiment

Figure 11:
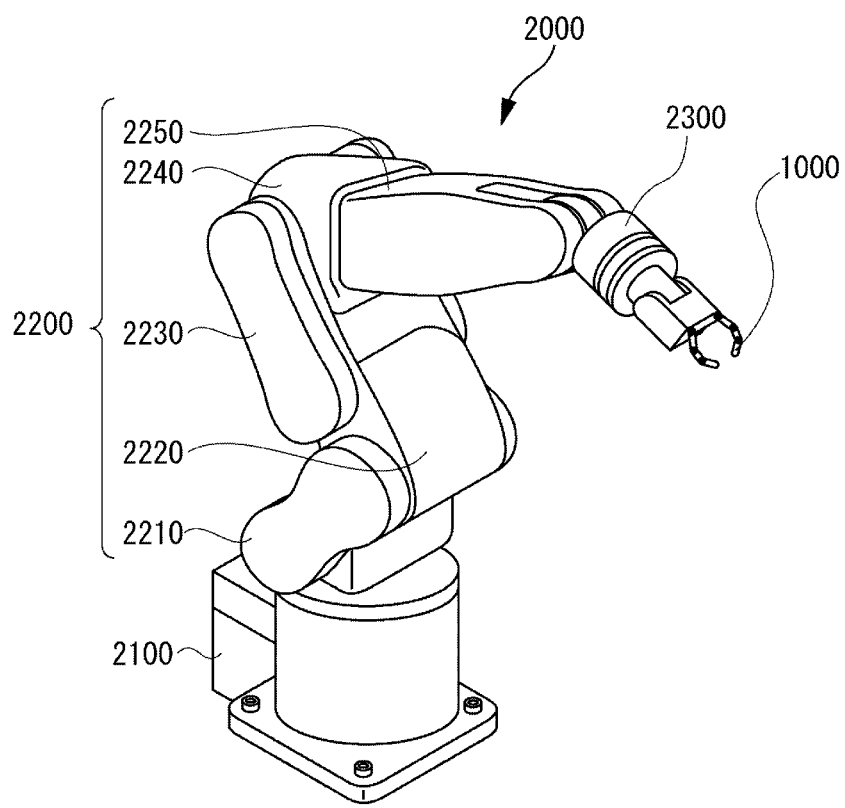
FIG. 11 is an outline view showing a robot according to a fourth embodiment.

FIG. 11 is an outline view showing a configuration of a robot 2000 including the robot hand 1000 according to the third embodiment. The robot 2000 includes a main body portion 2100, an arm portion 2200, and the robot hand 1000, and the robot 2000 shown in the drawing is classified as a so-called multi-jointed robot. The main body portion 2100 is fixed onto a floor, a wall, ceiling, or a movable carriage, for example. The arm portion 2200 is provided to be movable compared to the main body portion 2100, and an actuator (not shown) generating power for rotating the arm portion 2200 or a control unit (not shown) which controls the actuator and the like are embedded in the main body portion 2100.

The arm portion 2200 is configured of a first frame 2210, a second frame 2220, a third frame 2230, a fourth frame 2240, and a fifth frame 2250. The first frame 2210 is rotatably or bendably connected to the main body portion 2100, through a rotating and bending axis. The second frame 2220 is connected to the first frame 2210 and the third frame 2230, through a rotating and bending axis. The third frame 2230 is connected to the second frame 2220 and the fourth frame 2240, through a rotating and bending axis. The fourth frame 2240 is connected to the third frame 2230 and the fifth frame 2250, through a rotating and bending axis. The fifth frame 2250 is connected to the fourth frame 2240, through a rotating and bending axis. The arm portion 2200 is driven by a complex rotation or bending of each of frames 2210 to 2250 around each rotating and bending axis under the control of the control unit.

On another side of the fifth frame 2250 of the arm portion 2200 where the fourth frame 2240 is provided, a robot hand connection portion 2300 is connected, and the robot hand 1000 is attached to the robot hand connection portion 2300. The actuator 100 which applies the rotating operation to the robot hand 1000 is mounted in the robot hand connection portion 2300 and the robot hand 1000 can grip the object. By using the small-sized and light robot hand 1000, it is possible to provide a robot having expanded versatility which can operate and inspect complicated assembly of the electronic device.

Fifth Embodiment

Figure 12:
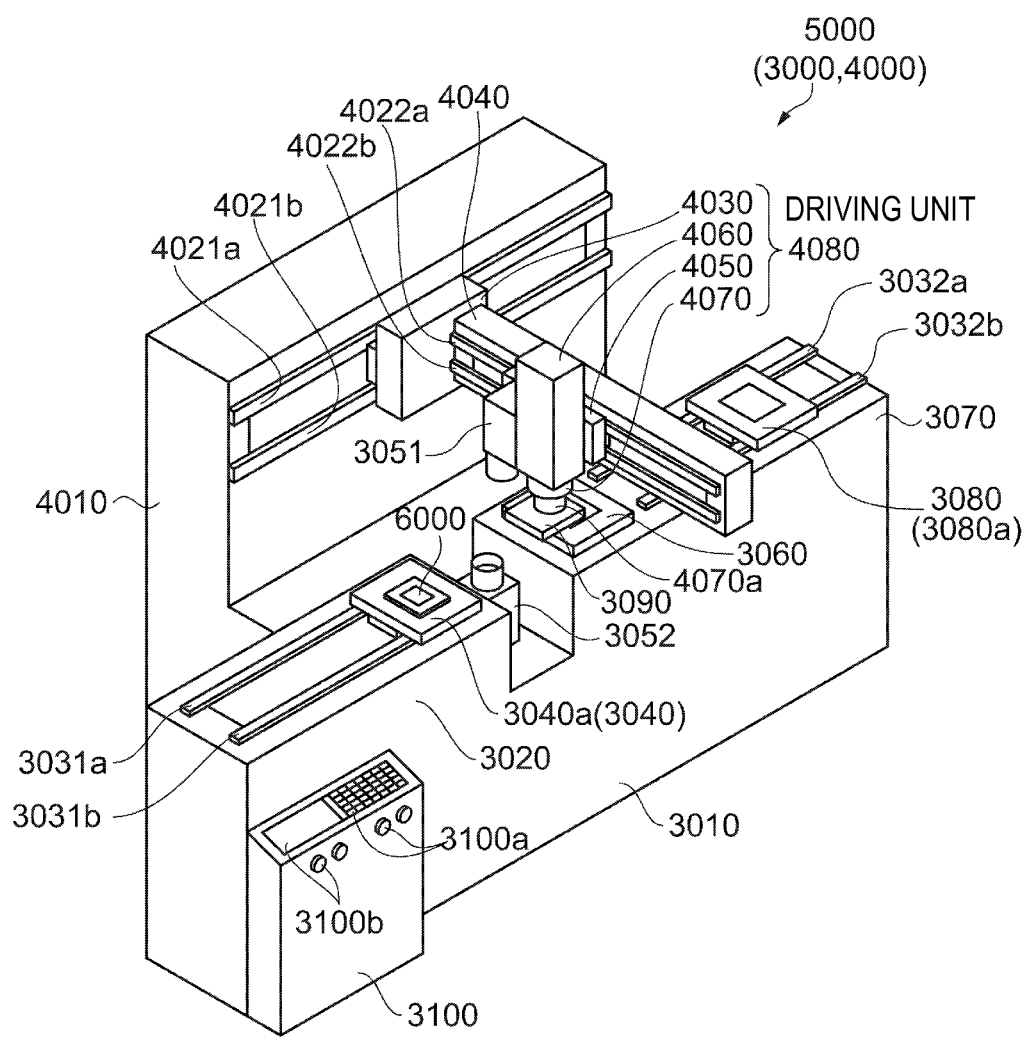
FIG. 12 is an outline view showing an electronic component inspection device according to a fifth embodiment.

FIG. 12 is an outline view showing an electronic component inspection device including the actuator 100 according to the first embodiment, and including an electronic component carrier robot as an embodiment of a Cartesian coordinate robot. An electronic component inspection device 5000 (hereinafter, referred to as an inspection device 5000) shown in FIG. 12 includes a portion 3000 that includes a function of inspecting electrical properties of an electronic component (hereinafter, referred to as an inspection unit 3000), and a carrying device unit 4000 as an electronic component carrier robot which carries the electronic component between predetermined positions (hereinafter, referred to as a carrying device unit 4000).

The inspection device 5000 shown in FIG. 12 includes a device base 3010 having a cuboid shape. A longitudinal direction of the device base 3010 is set as a Y direction, and a direction perpendicular to the Y direction in a horizontal surface is set as an X direction. The vertical direction is set as a Z (−) direction.

A material feeding device 3020 is provided on the left side of the drawing on the device base 3010. On the upper surface of the material feeding device 3020, a pair of guiding rails 3031a and 3031b extending in the Y direction are provided to protrude over entire width of the Y direction of the material feeding device 3020. A stage 3040 including a direct-operated mechanism is attached on the upper side of the pair of guiding rails 3031a and 3031b. The direct-operated mechanism of the stage 3040 is a directed-operated mechanism including a linear motor which extends in the Y direction along with the guiding rails 3031a and 3031b, for example. In the direct-operated mechanism, when driving signals corresponding to predetermined numbers of steps are input to the linear motor, the liner motor moves forwards or backwards, and the stage 3040 reciprocates along with the Y direction for the time corresponding to the number of the steps. A surface of the stage 3040 facing the Z direction is a loading surface 3040a, and an electronic component 6000 is loaded on a loading surface 3040a. A substrate chuck mechanism of a suction type is provided on the stage 3040. The substrate chuck mechanism fixes the electronic component 6000 to the loading surface 3040a.

In the device base 3010, a second imaging unit 3052 as an imaging unit is provided on the Y direction side of the material feeding device 3020. The second imaging unit 3052 includes an electric circuit substrate in which a CCD (Charge Coupled Device) element or the like converting received light into an electric signal is mounted, an objective lens including a zooming mechanism, an epi-illumination device, and an automatic focusing mechanism. Accordingly, when the electronic component 6000 is positioned in a place opposed to the second imaging unit 3052, the second imaging unit 3052 can image the electronic component 6000. Since the second imaging unit 3052 images after emitting light to the electronic component 6000 to focus, it is possible to image a focused image.

In the device base 3010, an inspection table 3060 is provided on the Y direction side of the second imaging unit 3052. The inspection table 3060 is a jig for transmitting and receiving an electric signal when inspecting the electronic component 6000.

On the device base 3010, a material removing device 3070 is provided on the Y direction side of the inspection table 3060. A pair of guiding rails 3032a and 3032b extending in the Y direction are provided to protrude over an entire width on the upper surface of the material removing device 3070. A stage 3080 including a direct-operated mechanism is attached on the upper side of the pair of guiding rails 3032a and 3032b. The direct-operated mechanism of the stage 3080 can use the same mechanism as the directed-operated mechanism included in the material feeding device 3020. The stage 3080 reciprocates along with the guiding rails 3032a and 3032b. A surface of the stage 3080 facing the Z direction is a loading surface 3080a and the electronic component 6000 is loaded on a loading surface 3080a.

A support table 4010 having an approximately cuboid shape is provided in the X (−) direction of the device base 3010. The support table 4010 is formed to be higher in Z (+) direction compared to the device base 3010. A pair of driving rails 4021a and 4021b as the pair of driven bodies extending in the Y direction are provided to protrude over entire width of the Y direction of the support table 4010 on a surface of the support table 4010 facing the X direction. A Y stage 4030 including a direct-operated mechanism moving along with the pair of driving rails 4021a and 4021b is attached on the X direction side of the pair of driving rails 4021a and 4021b. At least one of the driving rail 4021a and the driving rail 4021b is the driven body 72 (see FIGS. 1A to 1C) of the actuator 100 according to the first embodiment, and the piezoelectric element 10 which comes in contact with at least one of or both of the driving rail 4021a and the driving rail 4021b is provided on a direct-operated mechanism of the Y stage 4030. By vibrating the piezoelectric element 10 provided on the Y stage 4030, the Y stage 4030 reciprocates along with the driving rails 4021a and 4021b relative to the fixed driving rails 4021a and 4021b.

A rectangular columnar arm portion 4040 extending in the X direction is provided on a surface of the Y stage 4030 facing the X direction. A pair of driving rails 4022a and 4022b extending in the X direction are provided to protrude over entire width of the X direction of the arm portion 4040 on a surface of the arm portion 4040 facing the −Y direction. An X stage 4050 including a direct-operated mechanism which moves along the driving rails 4022a and 4022b is attached to the −Y direction side of the pair of driving rails 4022a and 4022b. At least one of the driving rail 4022a and the driving rail 4022b is the driven body 72 (see FIGS. 1A to 1C) of the actuator 100 according to the first embodiment, and the piezoelectric element 10 which comes in contact with at least one or both of the driving rail 4022a and the driving rail 4022b is provided on a direct-operated mechanism of the X stage 4050. By vibrating the piezoelectric element 10 provided on the X stage 4050, the X stage 4050 reciprocates along with the driving rails 4022a and 4022b relative to the fixed driving rails 4022a and 4022b.

A first imaging unit 3051 as an imaging unit and a Z movement device 4060 are provided on the X stage 4050. The first imaging unit 3051 includes the same function as in the configuration of the second imaging unit 3052. The first imaging unit 3051 and the second imaging unit 3052 configure the imaging units. The Z movement device 4060 includes a direct-operated mechanism therein, and the direct-operation mechanism lifts the Z stage up and down. A rotation device 4070 is connected to the Z stage. The Z movement device 4060 lifts the rotation device 4070 up and down in the Z direction. The direct-operated mechanism of the Z movement device 4060 can include the actuator 100 according to the first embodiment, or the actuator 300 according to the second embodiment, in the same manner as the Y stage 4030 driven along the driving rails 4021a and 4021b, and the X stage 4050 driven along the driving rails 4022a and 4022b.

The rotation device 4070 includes a rotating axis 4070a, and a grip portion 3090 is connected to the rotating axis 4070a. Accordingly, the rotation device 4070 can rotate the grip portion 3090 around the Z direction. In the embodiment, the rotation device 4070 can be used with the rotatably driving mechanism used with the driven body 71 (see FIGS. 1A to 1C) in the actuator 100 according to the first embodiment, configured combining with a deceleration device, and rotates the rotating axis 4070a at a predetermined angle. As the rotating mechanism, a step motor or a servo motor can be used. In a case of using the servo motor, types of the motors are not particularly limited, and an AC motor, a DC motor, a coreless motor, an ultrasonic motor or the like can be used. A driving unit 4080 is configured of the Y stage 4030, the X stage 4050, the Z movement device 4060, the rotation device 4070, and the like described above.

A control device 3100 as a control unit is provided on the X direction side of the device base 3010. The control device 3100 includes a function of controlling the operation of the inspection device 5000. In addition, the control device 3100 includes a function of inspecting the electronic component 6000. The control device 3100 includes an input device 3100a and an output device 3100b. The input device 3100a is a keyboard or an input connector, and a device which inputs an instruction of a user, in addition to a signal or data. The output device 3100b is an output connector or the like which performs output to the display device or an external device, and outputs a signal or data to another device. In addition, this is a device which transfers the state of the inspection device 5000 to the user.

In the configuration described above, the inspection unit 3000 is mainly configured of the device base 3010, the material feeding device 3020, the stage 3040, the first imaging unit 3051, the second imaging unit 3052, the inspection table 3060, the material removing device 3070, the stage 3080 and the like, and performs feeding, removing, image process, measurement of electric property, and the like of the electronic component 6000 as the inspecting target. The carrying device unit 4000 is mainly configured of the support table 4010, the driving rails 4021a and 4021b, the Y stage 4030, the arm portion 4040, the driving rails 4022a and 4022b, the X stage 4050, the Z movement device 4060, the rotation device 4070, and the like, and carries the electronic component 6000 from the material feeding device 3020 to the inspection table 3060, and then to the material removing device 3070.

The inspection device 5000 inspecting the electronic component 6000 is generally provided in a clean environment, that is, an environment under the control of dust. In addition, although not shown, a plurality of probes for measuring electric properties of the electronic component 6000 are disposed on the inspection table 3060, and the electronic component 6000 is necessarily carried from the material feeding device 3020 to the inspection table 3060 so that positions of the electronic component 6000 which is to be come in contact with the probes are reliably disposed with respect to all probes. Before being loaded on the inspection table 3060, the electronic component 6000 is image-processed by an image of the electronic component 6000 obtained by the first imaging unit 3051 and the second imaging unit 3052, is reliably positioned in the positions of the probes provided on the inspection table 3060 by the carrying device unit 4000, and then is loaded on the inspection table 3060.

Further, since the electronic component 6000 progresses accurate and multiple functions in a smaller size, a so-called one hundred percent inspection is generally performed. Accordingly, since the quantity of the electronic components 6000 to be inspected are significantly mass, it has been requested that a series of inspection time of the electronic component 6000 is to be shortened to perform the inspection process, and in particular, the carrying time of the electronic component 6000 accounted in the inspection time is shortened. By providing the Y stage 4030, the X stage 4050, and the Z movement device 4060 including the actuator 100 according to the first embodiment, or the actuator 300 according to the second embodiment, it is possible to control the accelerating time to the predetermined movement speed, and decelerating time to the stopping, in short time, and to obtain an electronic component inspection device having short inspection time. The inspection device 5000 can be applied as an electronic component inspection device inspecting for example, a semiconductor, a display device such as LCD, a crystal device, various types of sensor devices, an ink jet head, various MEMS devices and the like as the electronic component 6000.

Sixth Embodiment

Figure 13A:
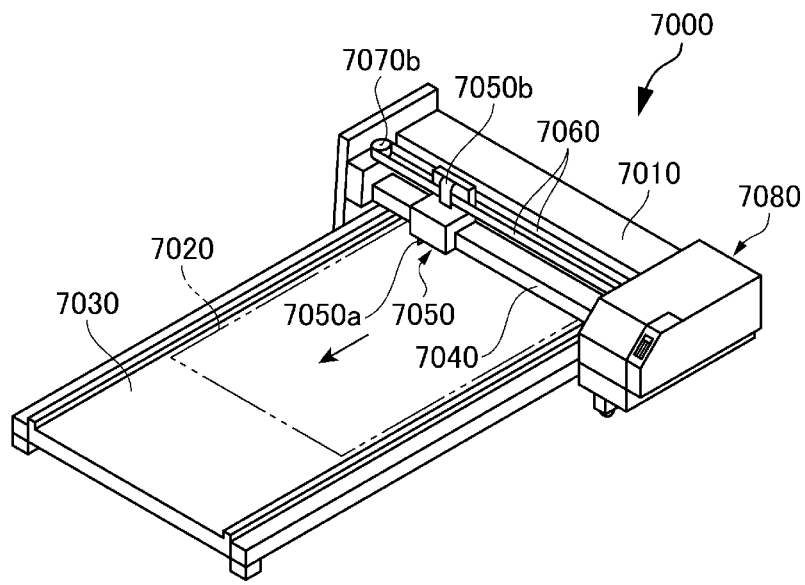
FIG. 13A is a perspective view showing a printer according to a sixth embodiment.
Figure 13B:
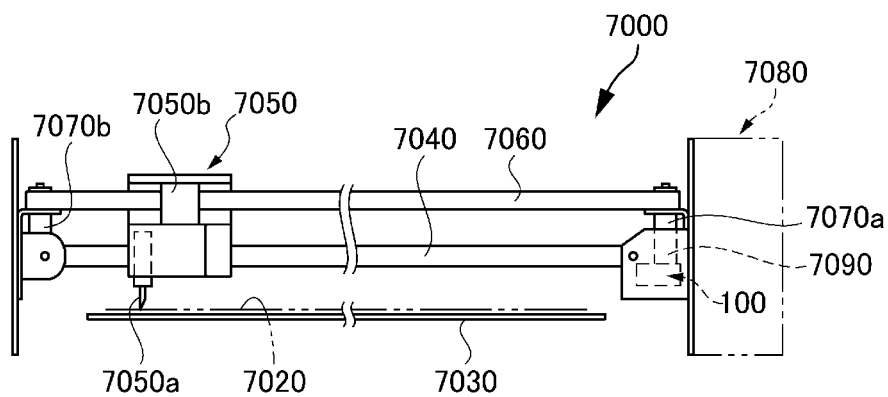
FIG. 13B is a view of a cutting head included in the printer shown in FIG. 13A.

FIGS. 13A and 13B show the printer according to the fifth embodiment, in which FIG. 13A is a perspective view showing the printer, and FIG. 13B is a view of a cutting head included in the printer shown in FIG. 13A.

As shown in FIG. 13A, a printer 7000 includes a print unit 510 that performs printing on printing paper 7020, a platen 7030 that holds the printing paper 7020 between the platen and the print unit 510, and is a guiding stage, a cutting head 7050 that cuts the printed printing paper 7020, and a control unit 7080 that controls the printer 7000. In this case, the cutting head 7050 has a method of cutting the printing paper 7020 in a direction perpendicular to a direction of carrying the printing paper 7020, and includes a cutter 7050a for cutting the printing paper 7020.

As shown in FIG. 13B, the configuration for cutting the printing paper 7020 includes a guiding rail 7040 that supports the cutting head 7050 and guides a movement of the cutting head 7050, a ring-like belt 7060 that moves the cutting head 7050 along the guiding rail 7040, a belt connecting portion 7050b for connecting the cutting head 7050 to the ring-like belt 7060, and driving axis 7070a and a driven axis 7070b that is disposed on a starting end side and a finishing end side of the movement of the cutting head 7050, for driving the ring-like belt 7060.

The driving axis 7070a is rotated by the actuator 100 and drives the ring-like belt 7060. In this case, the rotation of the rotating axis of the actuator 100 performs transfer to the driving axis 7070a through an acceleration device 7090. In the printer 7000 with the configuration described above, when the actuator 100 is driven, the driving axis 7070a rotates, the ring-like belt 7060 rotates between the driving axis 7070a and the driven axis 7070b due to the rotation of the driving axis 7070a, and the cutting head 7050 which is connected to the rotating ring-like belt 7060 moves along the guiding rail 7040. Accordingly, the cutter 7050a of the cutting head 7050 cuts the printing paper 7020.

By using the actuator 100 in the driving of the driving axis 7070a, since the vicinity of the driving axis 7070a has a compact configuration, the printer 7000 can be realized in a small size, and also has high durability.

The entire disclosure of Japanese Patent Application No. 2011-266546, filed Dec. 6, 2011 is hereby expressly incorporated by reference herein.

What is claimed is:

1. An actuator comprising:
    a piezoelectric element that vibrates by exciting a bending vibration mode, or vibrates by simultaneously exciting the bending vibration mode and a longitudinal vibration mode;
    a driven body that contacts a contacting portion of the piezoelectric element, and is driven by a vibration of the contacting portion;
    a holding unit that holds the piezoelectric element; and
    a base that includes a biasing unit which biases the holding unit to the driven body,
    wherein the holding unit is disposed in a direction intersecting a vibrating surface of the piezoelectric element, and includes:
        a first support unit and a second support unit which are disposed on one side of the piezoelectric element,
        a third support unit which is opposed to the first support unit through the piezoelectric element and is disposed on the other side of the piezoelectric element, and
        a fourth support unit which is opposed to the second support unit through the piezoelectric element and is also disposed on the other side of the piezoelectric element.

2. The actuator according to claim 1,
    wherein the piezoelectric element is a rectangular substrate having a length along a direction perpendicular to a bending vibration direction of the bending vibration mode set as L and a length along the bending vibration direction set as W, and includes a first support region in which the first support unit and the third support unit support the piezoelectric element, and a second support region in which the second support unit and the fourth support unit support the piezoelectric element,
    when a distance between a first centroid Q1 of the first support region and a node of vibration P1 which is disposed closest to one end portion of the piezoelectric element in the length L direction is set as a distance D1, and a distance between a second centroid Q2 of the second support region and a node of vibration P2 which is disposed closest to another end portion of the piezoelectric element in the length L direction is set as a distance D2,
    the distance D1 and the distance D2 satisfy D1≤0.13 L and D2≤0.13 L, and
    the first support region includes the node of vibration P1 and the second support region includes the node of vibration P2.

3. The actuator according to claim 2,
    wherein an outer edge portion of the first support region and the second support region is provided on an inner side with respect to an outer edge portion of the vibrating surface of the piezoelectric element.

4. The actuator according to claim 2,
    wherein at least one of first support region and the second support region has a rectangular shape.

5. The actuator according to claim 2,
    wherein at least one of the first support region and the second support region includes a first region in which a width along a direction perpendicular to the bending vibration direction gradually becomes smaller than a width of the longitudinal vibration mode including the first centroid Q1 or the second centroid Q2 in the longitudinal vibration direction extending from the first centroid Q1 or the second centroid Q2 in the bending vibration direction.

6. The actuator according to claim 5, further comprising:
a rectangular second region that includes the first centroid Q1 or the second centroid Q2; and
a first region that extends to the second region.

7. The actuator according to claim 1,
wherein at least one of the first support unit and the third support unit and at least one of the second support unit and the fourth support unit include a buffer unit.

8. The actuator according to claim 7,
wherein at least one of the first support unit and the third support unit and at least one of the second support unit and the fourth support unit include an elastic portion.

9. An actuator comprising:
a piezoelectric element;
a first support unit and a second support unit that are disposed on one surface of the piezoelectric element, and support the piezoelectric element; and
a third support unit and a fourth support unit which are disposed on a second surface of the piezoelectric element which is opposite to the one surface of the piezoelectric element, and support the piezoelectric element,
wherein the third support unit is disposed to be opposed to the first support unit through the piezoelectric element,
the fourth support unit is disposed to be opposed to the second support unit through the piezoelectric element, and
the one surface and the second surface extend in a direction in which the piezoelectric element bendingly-vibrates.

\* \* \* \* \*